US007059896B2

(12) United States Patent
Matthews

(10) Patent No.: US 7,059,896 B2
(45) Date of Patent: Jun. 13, 2006

(54) CONFIGURABLE ADAPTER FOR USE WITH NARROW BASE SOCKET METER IN SWITCHBOARD APPLICATIONS

(76) Inventor: Christopher Howard Matthews, 5660 Broxton Cir., Norcross, GA (US) 30092-2015

( * ) Notice: Subject to any disclaimer, the term of this patent is extended or adjusted under 35 U.S.C. 154(b) by 29 days.

(21) Appl. No.: 10/874,937

(22) Filed: Jun. 22, 2004

(65) Prior Publication Data

US 2005/0282431 A1   Dec. 22, 2005

(51) Int. Cl.
*H01R 33/945* (2006.01)
(52) U.S. Cl. ..................................... 439/517
(58) Field of Classification Search ................ 439/517, 439/751, 839, 133, 304; 361/659–671, 822–823
See application file for complete search history.

(56) References Cited

U.S. PATENT DOCUMENTS 2,907,928 A * 10/1959 Rutledge et al. ............ 361/666
3,628,097 A * 12/1971 Kobryner .................... 361/660
5,181,166 A *  1/1993 Howell ....................... 361/659
5,404,269 A *  4/1995 Tajali ......................... 361/669
6,644,989 B1 * 11/2003 Robinson .................... 439/146

* cited by examiner

*Primary Examiner*—J. F. Duverne
(74) *Attorney, Agent, or Firm*—Sanford J. Asman

(57) ABSTRACT

The configurable adapter uses a relatively few components which allow it to be configured to have different heights to fit different switchboard cases. It includes a bracket designed to hold a particular type of meter or power monitor, with different brackets available to be assembled as a component of the configurable adapter. A new class of electricity revenue meters called a narrow base socket meter is described, and shown. The narrow base socket meter is adapted from a conventional socket meter which has a sufficiently narrow body by trimming its sides, top, and/or bottom, as necessary, to fit within the switchboard adapter, using a bracket which places the meter within the switchboard adapter so that its face can be flush with (or barely stick out from) the face of the switchboard. The adapter can also be used with standard socket base meters, which will stick out of the front of the switchboard panel, as well as with power monitoring devices by using suitable brackets, as described.

9 Claims, 10 Drawing Sheets

CONFIGURABLE ADAPTER FOR USE WITH NARROW BASE SOCKET METER IN SWITCHBOARD APPLICATIONS

BACKGROUND OF THE INVENTION

The present invention relates to electricity meters. In particular, the present invention relates to a configurable adapter and a new socket mounted electricity meter format, herein called a narrow base socket meter which can be used to enable a narrow base meter to be used as a switchboard meter, as well as to mount standard socket meters, along with power monitoring devices, all in several different sizes of switchboard cases.

As is known by those skilled in the electrical metering arts, socket mounted meters are used in numerous locations. As used herein, the term "narrow base socket meter" is intended to mean an electricity meter which is characterized by having (1) a conventional, industry standard socket configuration; (2) a body which is narrower than a conventional socket mounted meter, such that it can fit into a cradle inside a switchboard case; and (3) a cover which fits over the front of the meter and attaches to the switchboard case, rather than a conventional cylindrical cover which attaches to the base of the meter. As used herein, the term "narrow base socket" is intended to refer to a socket base for an electricity revenue utility meter, which has a conventional socket configuration but which is otherwise narrower than a conventional socket meter base.

By way of example, a narrow base socket is shown in FIGS. 20–21 (at reference number 830) in U.S. Pat. No. 6,421,230 entitled ADAPTER FOR CONVERTING A SWITCHBOARD CASE FOR USE WITH A SOCKET MOUNTED METER which issued on Jul. 16, 2002 to the present inventor. The invention described therein allows a standard socket meter, rather than the narrow base socket meter of the present invention, to be used in a switchboard case. However, due to the width of a standard socket meter, the meter and its cover extend out of the switchboard case, and only the meter's bayonet connectors extend into the narrow base socket.

While a narrow base socket of the type described in that patent can be used, as described therein, with a standard meter, the fact that the meter extends out of the case is not desirable in some switchboard applications. In many applications it would be more desirable to have an adapter which permits the use of a "standard" meter wherein the standard meter, nevertheless, is substantially flush with the panel when mounted.

Another issue which has been present heretofore relates to the fact that there are a number of different types of switchboard cases, and that they come in different lengths, and different manufacturers make them in different configurations. Further, there are commercial applications in which metering devices, called "power monitors", as contrasted to electricity revenue meters, are used in switchboard applications.

Despite the desire to have a configurable solution which would allow either standard or narrow base meters to be used in switchboard applications, while allowing, also for power monitoring meters to be used, as well, without the associated need to maintain a large inventory of adapters which are able to provide such flexibility and without the need to use switchboard meters, until now, no such solution has existed.

SUMMARY OF THE INVENTION

In accordance with the present invention, a configurable adapter and a narrow base socket meter for use therewith have been invented. The narrow base socket meter can be fitted into a switchboard case which includes a narrow base socket, whereby the face of the meter will be substantially flat with respect to the switchboard. This is possible using the narrow base socket meter of the present invention, as it can sit within a standard switchboard case, having a narrow base socket installed therein.

Further, the present invention includes configurable components which allow the use of commercially standard switchboard cases having a variety of different lengths and configurations, typically determined by their manufacturer, and, in addition to being useable with electricity revenue meters the present invention can also be used with power monitor devices.

DETAILED DESCRIPTION OF THE EXEMPLARY EMBODIMENTS

Figure 1:
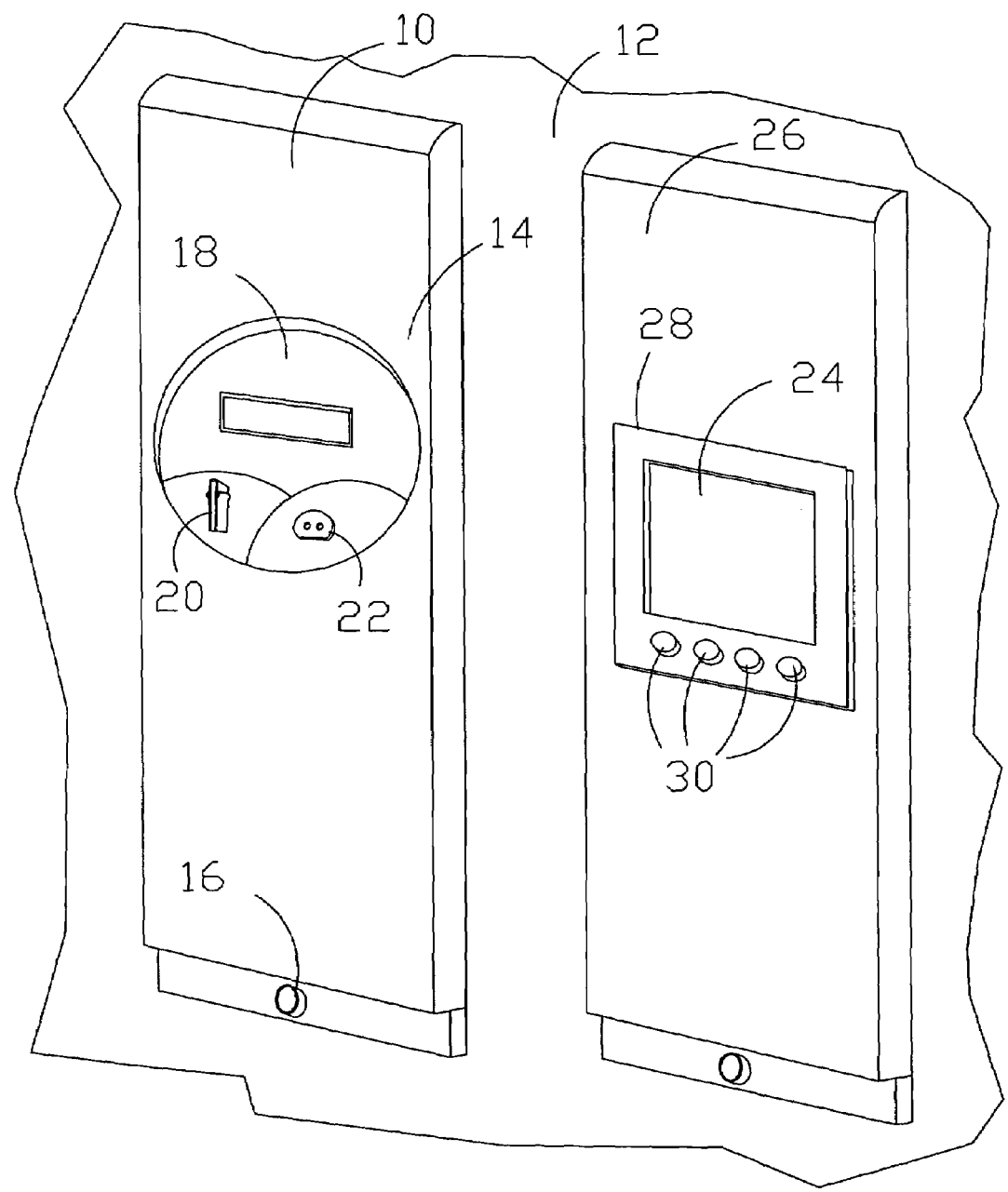
FIG. 1 is a front perspective view showing a portion of a switchboard on which the face of a narrow base socket meter, in accordance with the present invention, is shown along with power monitor mounted in the adapter of the present invention.

Referring first to FIG. 1, the narrow base socket meter 10 of the present invention is shown mounted on a switchboard panel 12 in a first embodiment of the configurable adapter of the present invention. As illustrated, the cover 14 of the narrow base socket meter 10 is attached (using a screwable knob 16) to the underlying switchboard case (not shown) so as to provide a cover for the narrow base socket meter 10, whose face 18 is visible therethrough. The cover 14 includes a demand reset 20 and an optical port 22 of the types well known in the electricity revenue metering field. With continued reference to FIG. 1, a power monitor device 24 is also mounted on the switchboard panel 14. As illustrated, a power monitor device cover 26 overlies and surrounds the power monitor device 24. While the power monitor device cover 26 is similar in configuration to the meter cover 14, it is configured to form an escutcheon around the face of the power monitor device 24 rather than to act as the face of the power monitor device 24. The power monitor device cover 26 has an opening 28 through which the controls 30 of the power monitor device 24 may be accessed.

Thus, the present invention can be configured to have a cover 14 which is a functional portion of the metering equipment, as is the narrow base socket meter cover 14, or it can have a power monitor device cover 26 which includes an opening 28, such that it provides a cosmetic benefit while closing off access to the underlying switchboard case, as shown with respect to the power monitor device cover 26. In either situation, the metering device or monitor can be mounted so that it is substantially flush with the switchboard panel 12.

Figure 2:
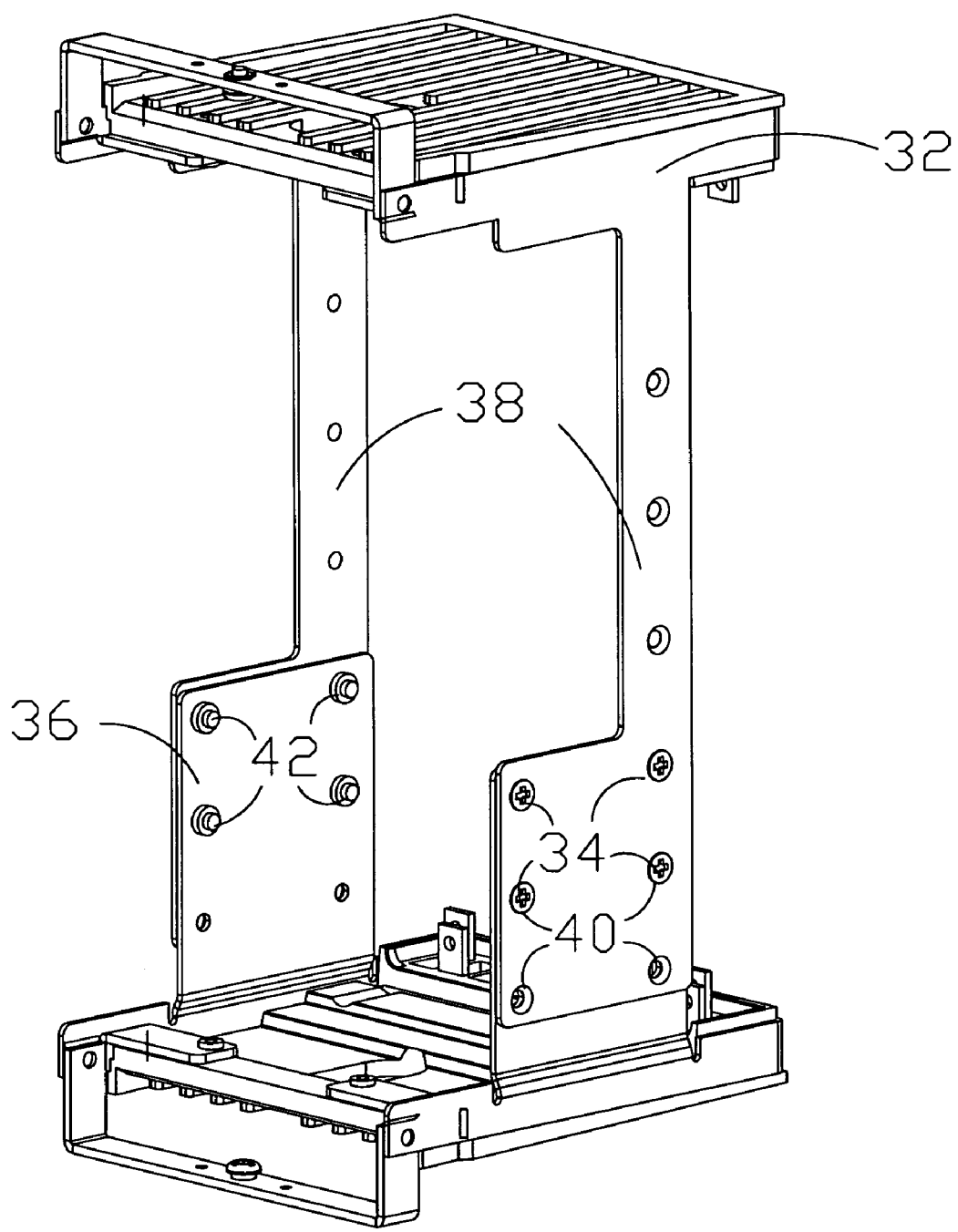
FIG. 2 is a prospective view showing one configuration of the adapter of the present invention.

Referring now to FIG. 2, a first embodiment of the configurable adapter 32 and narrow base meter of the present invention is shown. The adapter 32 is substantially similar to the switchboard cage described in U.S. Pat. No. 6,421,230, referenced above, and incorporated by reference herein, except that the adapter 32 has been improved in design so that it is configurable for use with switchboard cases having different heights. Further, the adapter 32 can be used with different brackets, as described hereinafter, so that it may be used with either standard meters having standard (round) bases, narrow base socket meters, or power monitoring devices. Thus, the configurable nature of the adapter 32 allows it to be used in switchboard cradles having different heights, and it can be used with different types and configurations of metering (or monitoring) devices.

In particular, the adapter 32 was designed to be assembled using screws 34 to connect a lower portion 36 to an upper portion 38 such that the overall height of the adapter 32 can be varied (See, FIG. 5), as appropriate, whereby the adapter 32 is configurable to fit into a variety of switchboard cradles having different heights. In the preferred embodiment of the adapter 32, this is accomplished by having a series of screw holes 40 in the upper portion, while the lower portion has a series of so-called PEM nuts 42, which are self-clinching nuts from PennEngineering Fastening Technologies, 5190 Old Easton Road, Danboro, Pa. 18916, to which the screws 34 attach. As shown in FIG. 2, the PEM nuts 42 may be installed in the lower portion 36 of the adapter 32 only in those openings which will be used when the adapter 32 is assembled.

Figure 3:
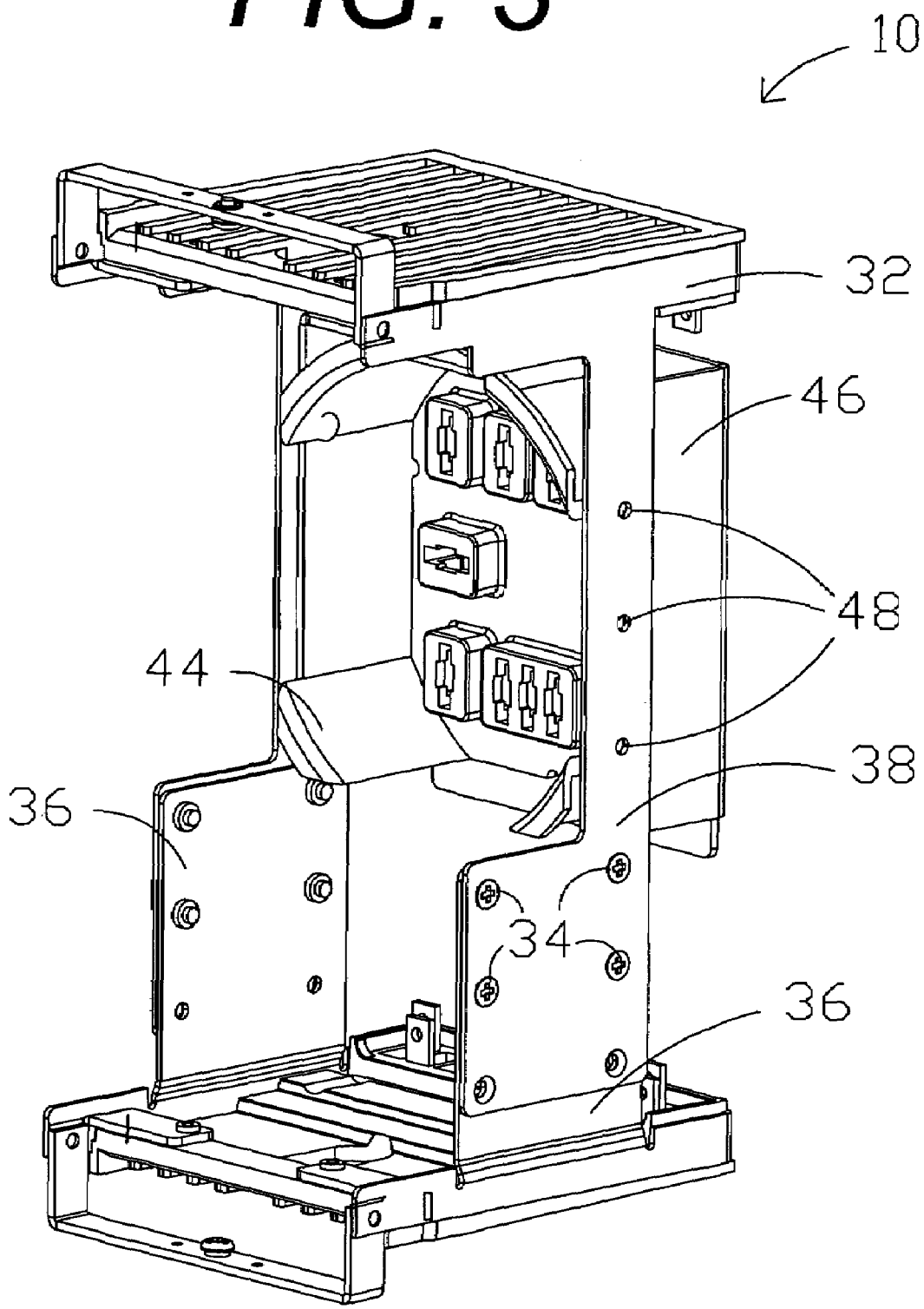
FIG. 3 is a prospective view of the adapter of FIG. 2 illustrating the adapter with narrow meter base mounted therein.

Referring now to FIG. 3, the adapter 32 is shown with a narrow socket base 44, the same being a part of the narrow base socket meter 10 of the present invention. As shown, the narrow socket base 44 is mounted to the upper portion 38 of the adapter 32 using a bracket 46. As used herein, the term "narrow base socket meter" is intended to refer to a socket meter which has a base whose width is narrower than the base of a standard socket meter, and which is narrow enough to be mounted within the sides of the adapter 32 the while having the same bayonet connections as a standard socket meter. Accordingly, the body of the narrow base socket meter of the present invention is capable of being mounted in a standard meter socket of the type used by a standard socket meter. As is well known in the art, standard socket meter bases have substantially round bases. As shown in FIG. 3, the narrow socket meter base 44 which is used in the present invention differs from a standard socket meter base in that it is narrower than a standard socket meter in that its sides are cut off substantially parallel to one another along chords of the circular base. Such "narrow base sockets" were previously described by the present inventor in U.S. Pat. No. 6,421,230. However, in that patent the base was mounted at the front of the adapter so that a conventional socket meter (which would then extend out from a switchboard panel) could be mounted in it. In accordance with the present invention, the narrow socket meter base 44 is mounted at the rear of the adapter 32, as the body of the narrow socket meter of the present invention is narrow enough to slide into the adapter 32 even though the narrow socket meter has a contact configuration which is the same as that of a conventional meter.

In order to mount the narrow meter socket base 44 a bracket 46, designed to receive the narrow socket base 44 is attached to the upper portion 38 of the adapter 32. As will be further explained below, the bracket 46 is an integral part of the present invention, as a set of brackets allows the same adapter (which can be configured for height, as already explained) to be further configured to hold either a meter socket base 44 or a power monitor device, as will be shown, or such other devices as may be desired.

Figure 4:
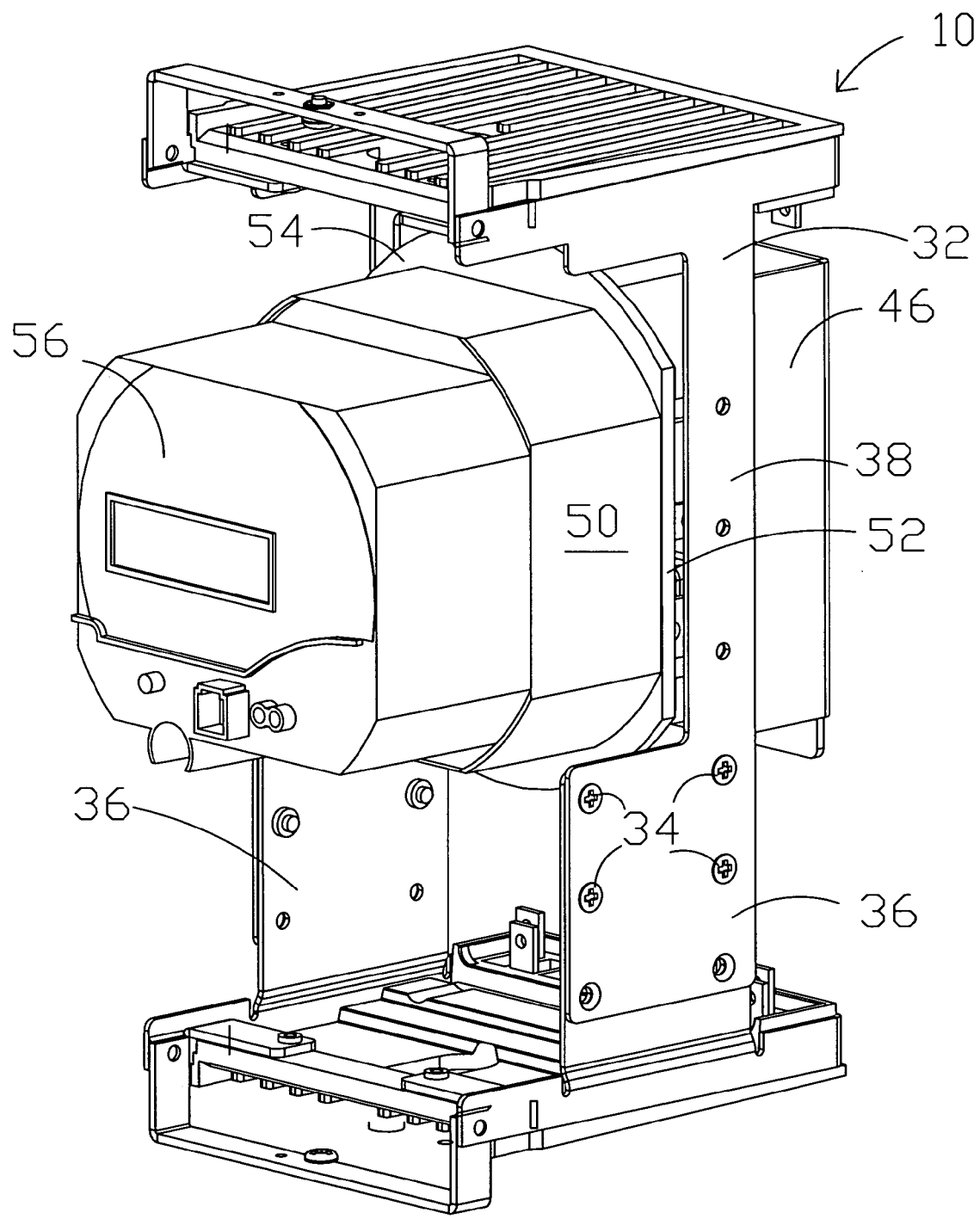
FIG. 4 is a prospective view of the adapter of FIG. 3 with a narrow base socket meter (without the cover, which is shown in FIG. 1) of the present invention mounted therein, and illustrating one configuration of the adapter.

With reference to FIG. 4, the narrow base socket meter 10 is able to be mounted with its cover 14 flush the switchboard panel 12 (See FIG. 1), because the narrow base socket meter 10 has a narrow meter body 50, which is narrow enough to be mounted within the adapter 32. The narrow base socket meter 10 of the present invention was created by the present inventor who realized that a commercially available electronic meter, namely, the Schlumberger Sentinel Multifunction Meter was being built with a conventional round base for use with conventional meter sockets. Nevertheless, the Sentinel, and other suitable meters which may be available or which may become available, have a body configuration which, but for their round bases and cylindrical covers, could otherwise fit within a switchboard case to form a narrow base meter 10, as shown in FIG. 1. The inventor realized that if the meter body could fit within the adapter 32, and the sides of the meter's base could also be trimmed to fit, there was no reason that a conventional, commercially available meter could not be modified such that it would fit the narrow meter base 44, even with the narrow meter base 44 mounted at the rear of the adapter 32. By so modifying the meter body, and trimming the sides 52 of the base 54 such that the sides 52 fit within the adapter 32 so that the meter 10 could be set into the adapter 32, whereby it would be within the switchboard, rather than sticking out of the front of the switchboard, as did the conventional meters used with the previously described adapters as described in the inventor's other patents.

With further reference to FIG. 1 and FIG. 4, the meter 10, differs from conventional meters in that the sides 52 of the base 54 are substantially parallel to one another, so the meter base 54 is no longer round. While this may mean that the sides of the base must be cut, it can also mean that the top and/or bottom of the meter must also be cut down in size. This means that a conventional, substantially cylindrical cover cannot be used with the narrow base meter 10.

Accordingly, the cover 14 (See FIG. 1) has been designed to replace the conventional meter covers previously known. As such, the meter cover 14 includes access to the reset and optical ports of the meter 10, as explained above, and the cover 14 includes a transparent portion which permits allows the face 56 of the meter 10 to be viewed through the cover 14.

Figure 5:
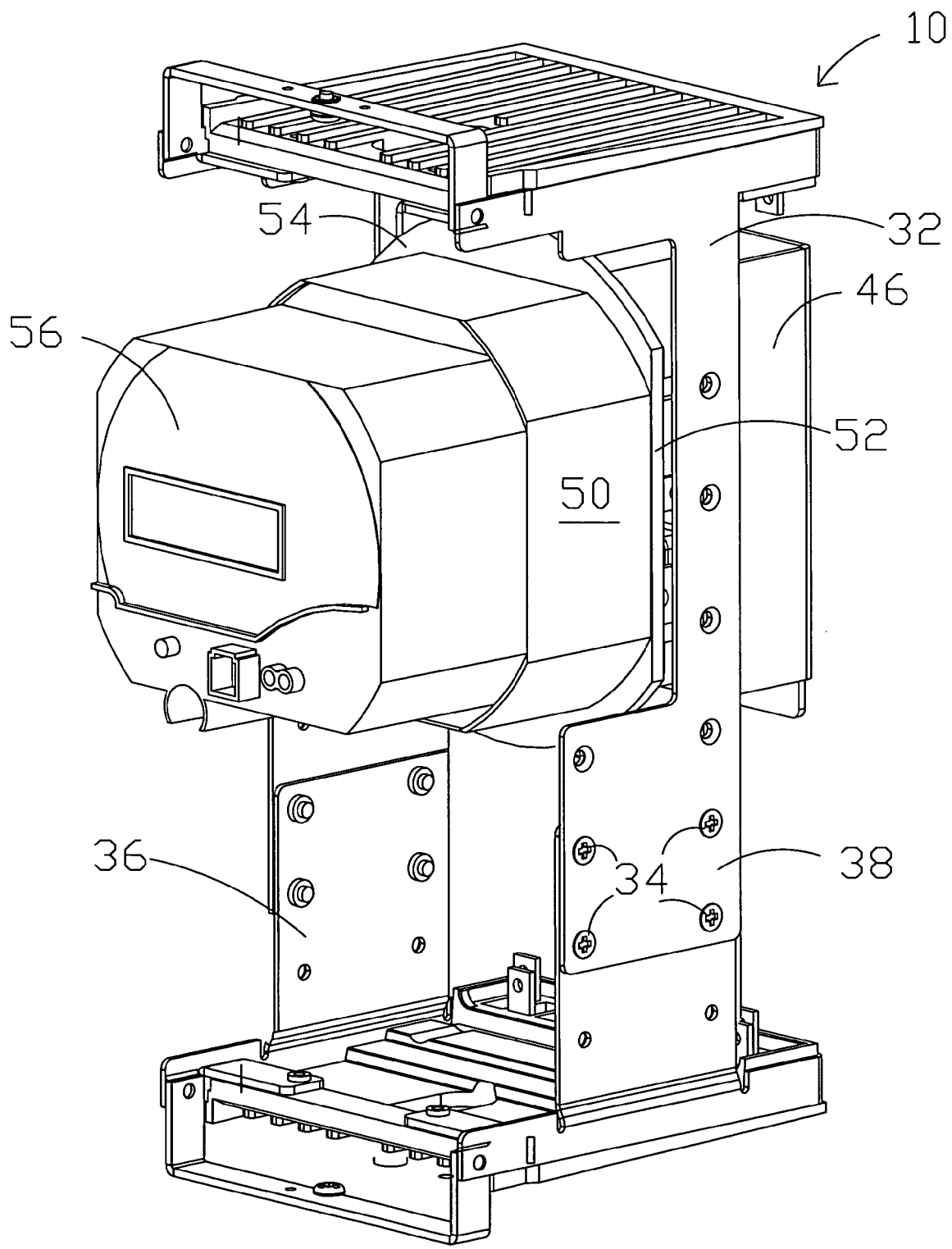
FIG. 5 is a prospective view of the adapter of FIG. 3 with a narrow base socket meter (without the cover, which is shown in FIG. 1) of the present invention mounted therein, and illustrating a longer configuration of the adapter than the one shown in FIG. 4.

Referring now to FIG. 5, an alternative configuration of the adapter 32, with respect to the configuration shown in FIG. 4, is shown. In particular, the adapter 32 shown in FIG. 5 has been configured to be the same as is shown in FIG. 4, except that the lower and upper portions 38, 36 were assembled to make the overall adapter 32 longer so that the same components can be used in a taller switchboard case. Thus, without changing anything other than the placement of the screws on the adapter 32, the same adapter 32 can be used in switchboard cases having different heights. This is an important feature of the present invention, as it means that far fewer parts are required to be manufactured to meet a variety of needs. As will be further explained hereinafter, the modular nature of the present invention further facilitates configuration whereby devices, other than the narrow socket meter body 50 can be used. As will be recognized by those skilled in the art, it will, of course, be necessary to provide a suitable cover in each application, although the cover designs are also modular in that different types of adapters (e.g., designed for different types of switchboard cradles) can be interchanged based only on the required application and case height, as will be further discussed below.

Figure 6:
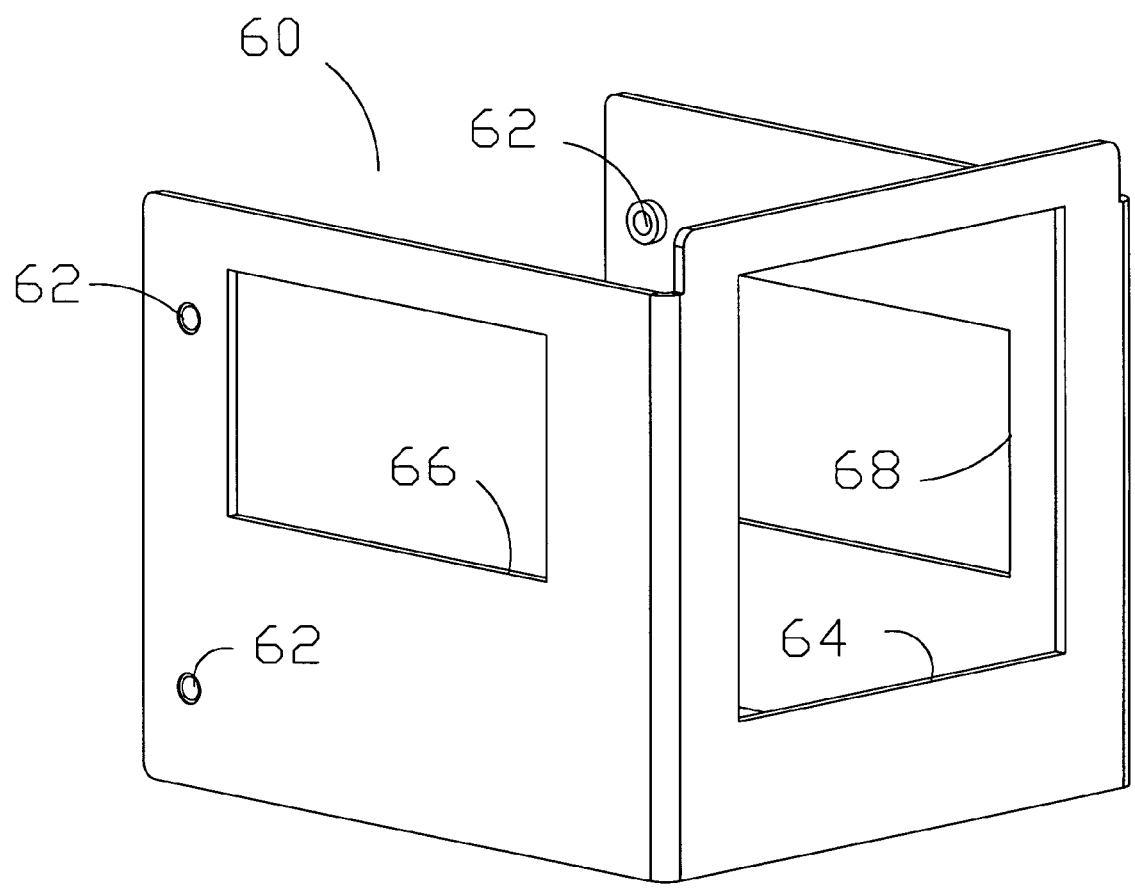
FIG. 6 is a prospective view of a power meter device bracket of the type which can be used with the adapter shown in FIG. 2, in order to mount a power monitor device, as illustrated in FIG. 1.

Referring now to FIG. 6, another feature which makes the present invention configurable is illustrated. In particular, the adapter 32 has been designed not only to act as a switchboard cradle for use with an electricity meter, as described above and in the earlier patents of the present inventor, but it has also been designed to be adaptable for use with industrial power monitoring devices, such as the power monitor 24 shown in FIG. 1, which are also often switchboard mounted. In order to configure the adapter 32 for use with different devices, the present invention uses brackets. Thus, with reference to FIGS. 3, 4 and 5, a narrow base socket bracket 46 was shown, in that the adapter 32 was configured to hold the narrow base socket meter 10 of the present invention, as shown in FIG. 1. As illustrated in FIGS. 3–5, the narrow base socket bracket 46 mounts at the rear of the adapter 32, such that a narrow base socket 44 can be mounted to receive the narrow base meter body 50, as shown in FIG. 5. In order to configure the adapter 32 for use with a power monitor 24 (FIG. 1), the bracket 60 has been designed to attach to the adapter 32, using screws in the same holes as previously described. As shown, the bracket 60 includes number of screw holes 62 which allow it to be assembled to the adapter 32. The power monitoring device bracket 60 has an opening 64 which exposes the power meter 24, which may actually extend therethrough (See FIG. 1). It also has a number of additional openings 66, 68 which can provide access to a mounted power meter. As will be understood, unlike the narrow base socket bracket 46, which was mounted to the rear of the adapter 32, the power monitor device bracket 60 is mounted so that the face of the power monitor device 24 will be toward the front of the adapter 32.

Figure 7:
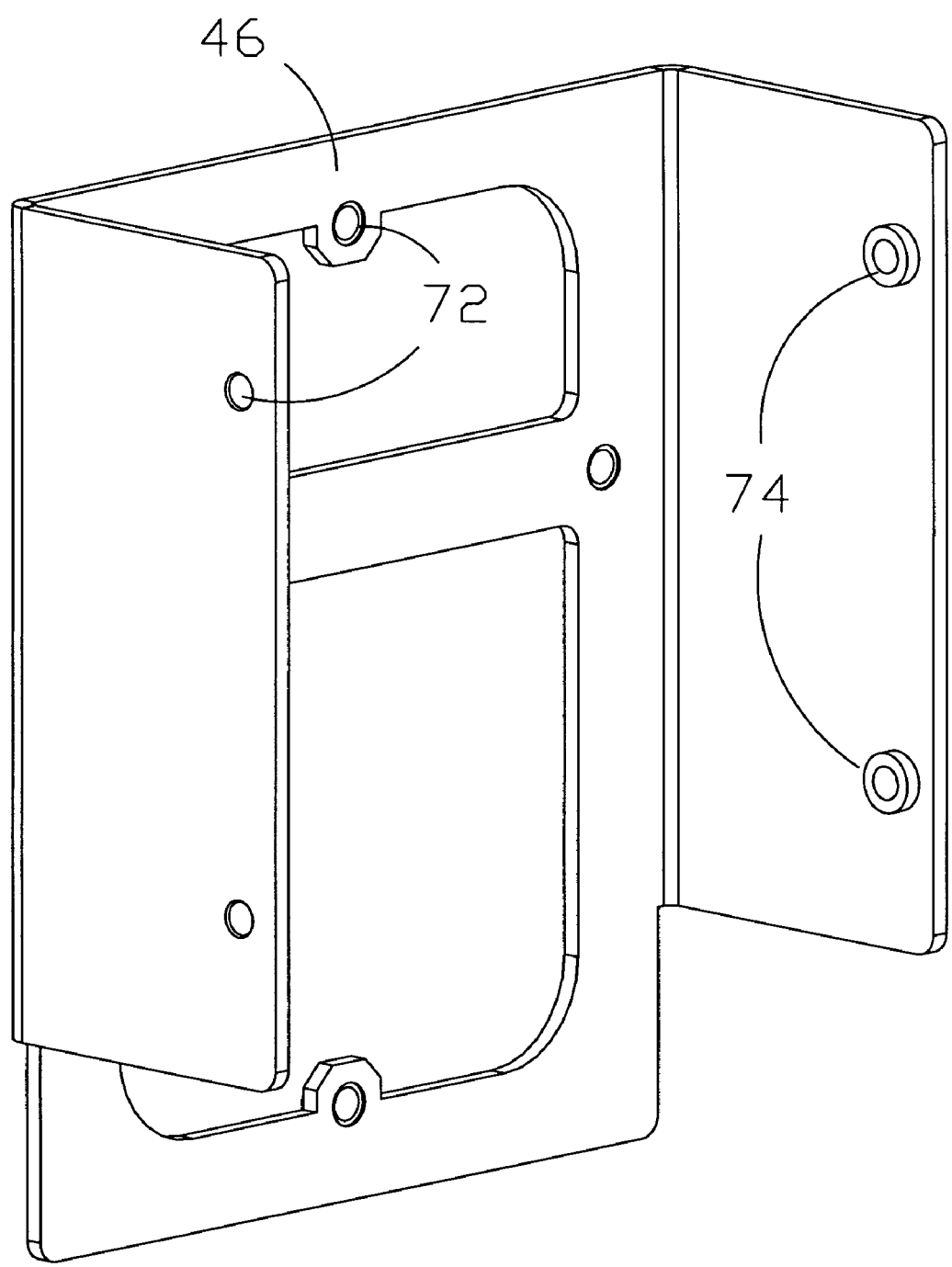
FIG. 7 is a prospective view of a meter socket bracket of the type which can be used with the adapter shown in FIG. 2, in order to mount a narrow base socket meter, as illustrated in FIG. 1.

As shown in FIG. 7, the narrow base socket bracket 46 which was previously described with reference to FIGS. 3–5 and 6 has a number of screw holes 72 which allow it to be assembled to the adapter 32. The narrow base socket bracket 46 is configured such that it has the PEM nuts 74 on the inside of the bracket 46 for mounting to the upper portion 38 of the adapter 32, while the screw openings 72 are on the side of the bracket 46 which will be adjacent the upper portion 38 of the adapter 32 and the rear of the narrow base socket 46.

Figure 8:
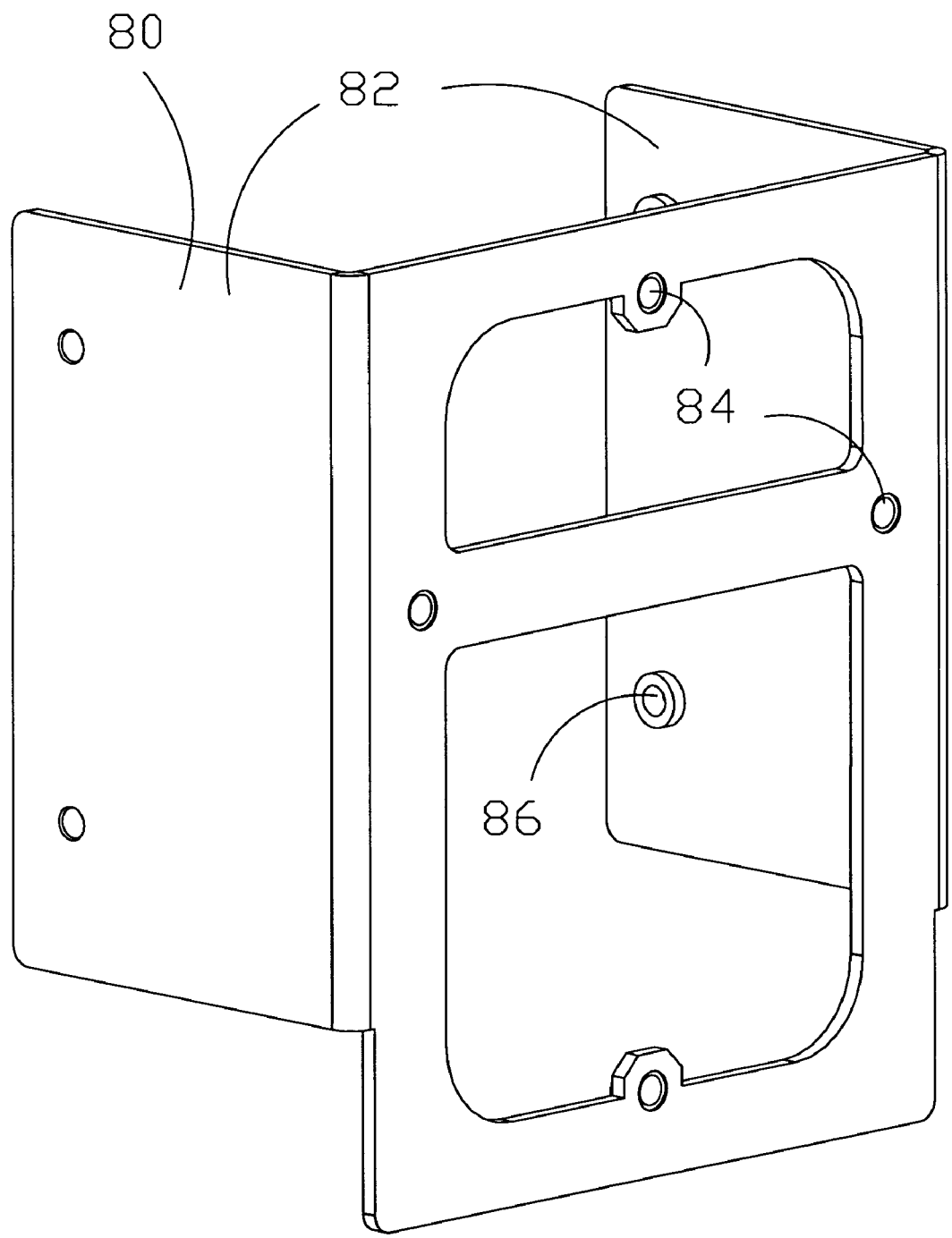
FIG. 8 is a prospective view of a meter socket bracket of the type which can be used with the adapter shown in FIG. 2, in order to mount a narrow base socket, such that a standard socket meter can be mounted using the present adapter.

Referring, now, to FIG. 8, a standard socket meter bracket 80 can also be used with the adapter 32. The standard socket meter bracket 80 is similar to the narrow base meter bracket 46, except that it will be mounted toward the front of the switchboard case, thereby bringing the meter socket forward such that only the bayonet connectors of a standard socket meter will extend into the socket (a narrow base socket which fits inside the meter case, as heretofore described in U.S. Pat. No. 6,421,230). Accordingly, the legs 82 have a length which will bring the narrow base socket (not shown) suitably close to the front of the case, as illustrated in the inventor's earlier patent. The screw openings 84 which are used to attach the meter socket are the same as in the bracket 46, but the placement of the PEM nuts 86 will be changed so that the meter socket can be mounted to the front of the case when it is installed.

Figure 9:
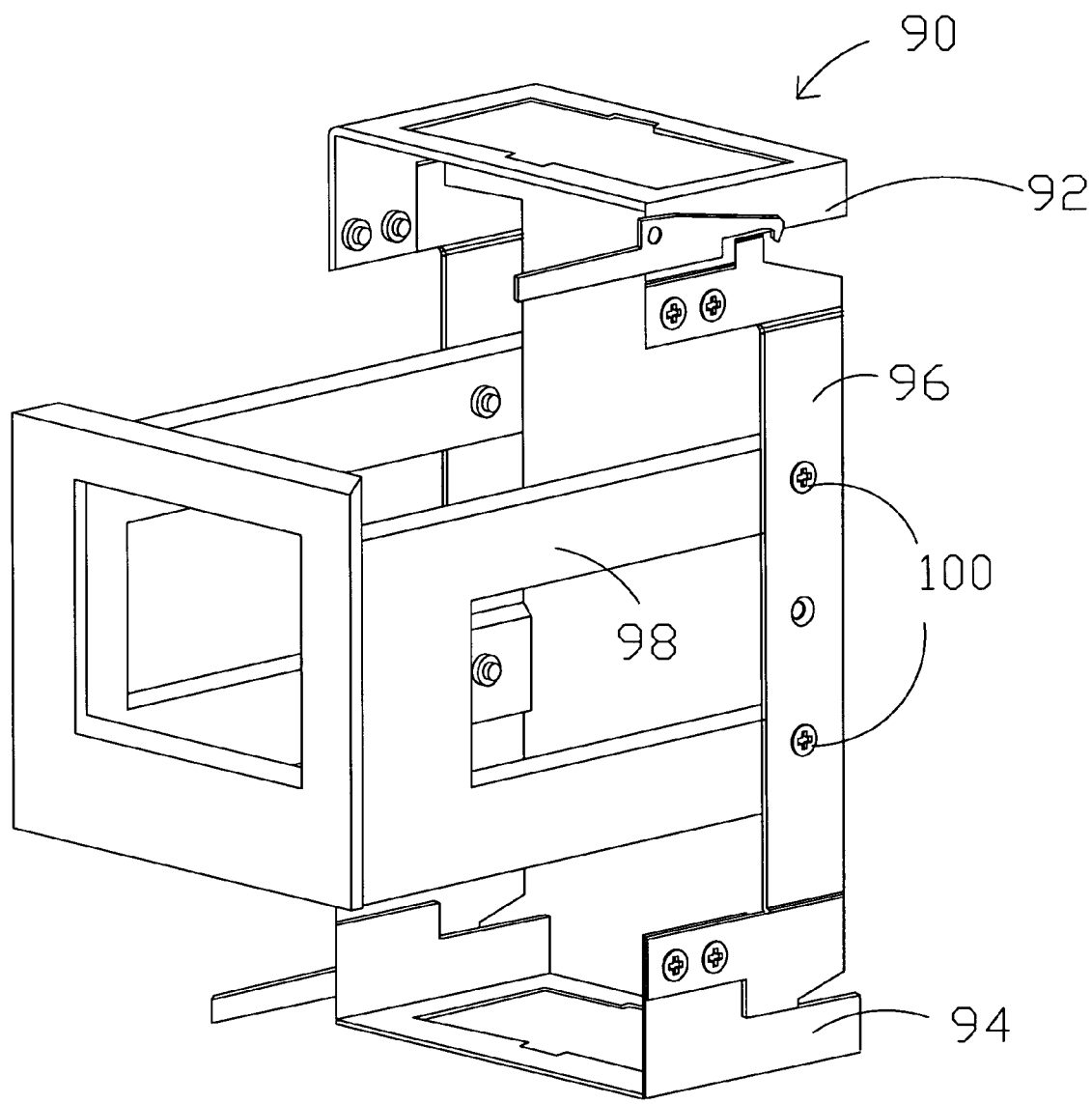
FIG. 9 illustrates another embodiment of the configurable adapter in which a power monitor device bracket of the type illustrated in FIG. 6 is shown.
Figure 10:
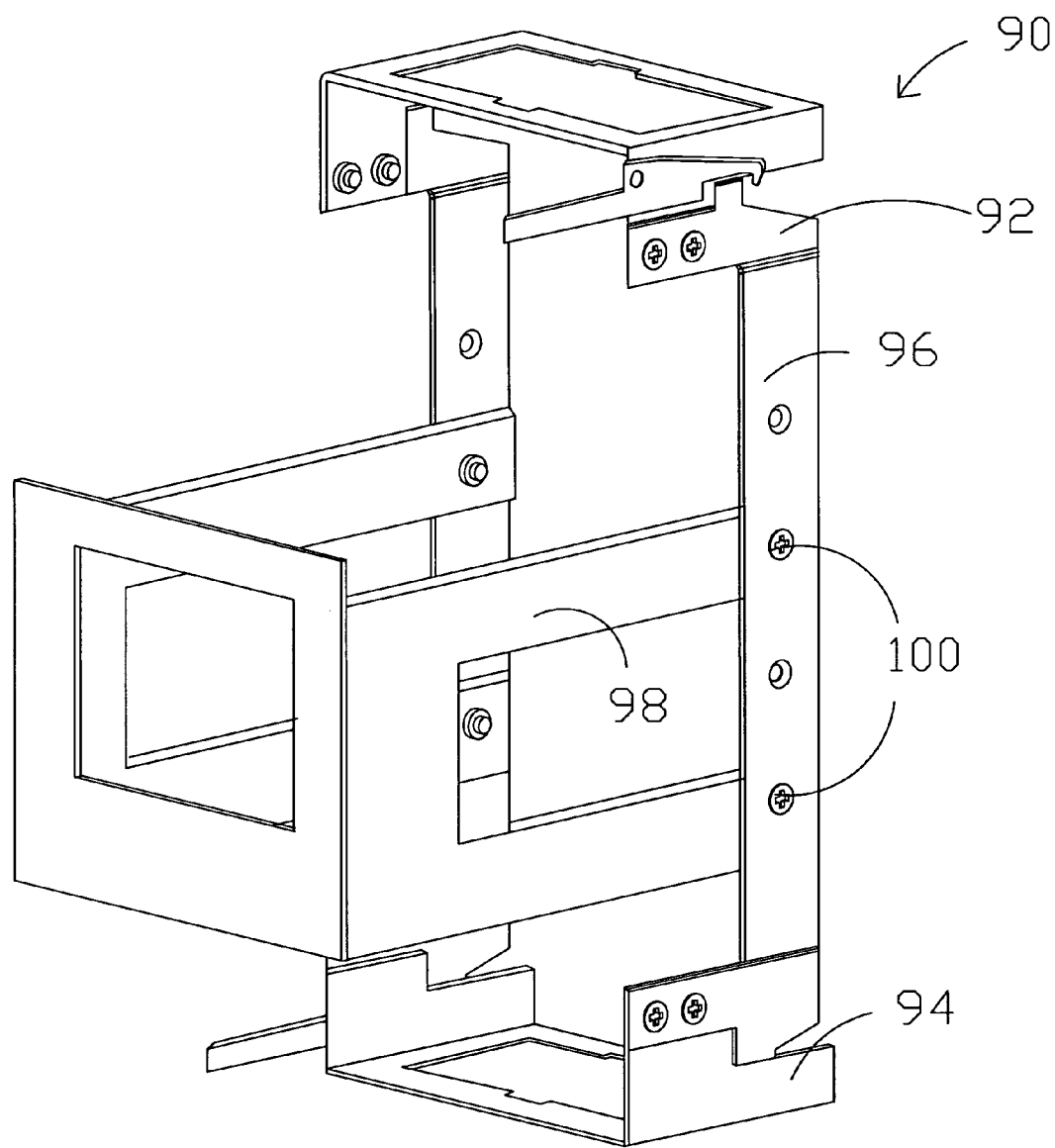
FIG. 10 illustrates the embodiment of the configurable adapter and a power monitor device bracket, as shown in FIG. 9, but with the adapter configured for a longer switchboard case.

Referring to FIGS. 9 and 10, another embodiment 90 of the present invention is illustrated. As shown therein, the adapter 90 differs from the adapter 32 heretofore described so that it can be used with switchboard cases of another manufacturer. As with the adapter 32, the adapter 90 was designed so that it can be used with switchboard cases of different heights. However, the adapter 90 accomplishes that in a manner different from the adapter 32, in that the adapter 90 is comprised of three components, namely an upper portion 92, a lower portion 94, and a middle insert 96. With reference to FIGS. 9 and 10, it will be understood that length of the middle insert 96 provides yet another means by which the height of the configurable adapter 90 of the present invention can be changed, although those skilled in the art will recognize that there exist many more ways to accomplish the same result, e.g., by using a screw and slot arrangement, as described heretofore by the present inventor in his other patents, namely, U.S. Pat. No. 6,104,601 entitled PANEL ADAPTER FOR A SOCKET MOUNTED ELECTRICITY METER, which issued Aug. 15, 2000; U.S. Pat. No. 6,259,956 entitled SURFACE MOUNTED PANEL ADAPTER FOR A SOCKET MOUNTED ELECTRICITY METER, which issued Jul. 10, 2001; U.S. Pat. No. 6,421,230 entitled ADAPTER FOR CONVERTING A SWITCHBOARD CASE FOR USE WITH A SOCKET MOUNTED ELECTRICITY METER, which issued Jul. 16, 2002; and U.S. Pat. No. 6,498,717 entitled SURFACE MOUNTED PANEL ADAPTER FOR A SOCKET MOUNTED ELECTRICITY METER, which issued on Dec. 24, 2002, all of which are incorporated herein by reference.

With continued reference to FIGS. 9 and 10, the adapter 90 is shown with a power monitor bracket 98, as shown in FIG. 6, mounted to it using screws 100 which attach to the middle insert 96 of the adapter 90 (See, also, openings 48 formed in the adapter 32 as illustrated, but not used, in FIG. 3).

As will now be recognized by those skilled in the art, the present invention is a fully configurable (meaning in both height adjustment and meter type) adapter for use in switchboard applications. Further, by modifying commercially available socket meters which have sufficiently narrow bases, such that the meter body can be fitted within the switchboard case a new "narrow socket meter" has been designed in which the new meter is mounted substantially flush with a switchboard panel.

Further, different designs have been shown for use with different switchboard cases manufactured by different manufacturers, with both height adaptation, and device adaptation (using different brackets). Thus, by using relatively few interchangeable components, the adapter of the present invention can be used in well over one hundred

I claim:

1. An adapter for mounting a metering device in a switchboard case, said adapter comprising:
   (a) a body comprising an upper portion and a lower portion;
   (b) means for connecting and selectively spacing said upper portion relative to said lower portion;
   (c) a bracket for mounting said metering device, said bracket being adapted to be attached to said body, said bracket being configured to hold a narrow base socket and wherein said bracket has legs which have a length which brings said narrow base socket to the front of said adapter when said adapter is mounted in a switchboard case, whereby a standard socket base meter can be mounted in said narrow base socket when said adapter is installed in a switchboard case.

2. The adapter of claim 1 in which said means for connecting and selectively spacing comprises different screw holes in said upper portion and said lower portion, whereby said upper portion can be assembled to said lower portion in a number of different configurations each having different heights.

3. The adapter of claim 1 in which said means for connecting and selectively spacing comprises a middle insert, said middle insert being configured to fit between said upper portion and said lower portion and to attach at a proximal end to said upper portion and at a distal end to said lower portion, whereby the overall height of said adapter is determined by the combined heights of said upper portion, said lower portion, and said middle insert.

4. An adapter for mounting a metering device in a switchboard case, said adapter comprising:
   (a) a body comprising an upper portion and a lower portion;
   (b) means for connecting and selectively spacing said upper portion relative to said lower portion;
   (c) a bracket for mounting said metering device, said bracket being adapted to be attached to said body, said bracket being configured to hold a power monitor and wherein said bracket has legs which have a length which brings the front of said power monitor to the front of said switchboard panel when said adapter is installed in a switchboard.

5. The adapter of claim 4 in which said means for connecting and selectively spacing comprises different screw holes in said upper portion and said lower portion, whereby said upper portion can be assembled to said lower portion in a number of different configurations each having different heights.

6. The adapter of claim 4 in which said means for connecting and selectively spacing comprises a middle insert, said middle insert being configured to fit between said upper portion and said lower portion and to attach at a proximal end to said upper portion and at a distal end to said lower portion, whereby the overall height of said adapter is determined by the combined heights of said upper portion, said lower portion, and said middle insert.

7. An adapter for mounting a metering device in a switchboard case, said adapter comprising:
   (a) a body comprising an upper portion and a lower portion;
   (b) means for connecting and selectively spacing said upper portion relative to said lower portion;
   (c) a bracket for mounting said metering device, said bracket being adapted to be attached to said body, said bracket being configured to hold a narrow base socket and wherein said bracket has legs which have a length which brings said narrow base socket to the rear of said adapter whereby the base of a socket base meter having a body which is narrow enough to fit within said case can be can be mounted in said narrow base socket when said adapter is installed in a switchboard case.

8. The adapter of claim 7 in which said means for connecting and selectively spacing comprises different screw holes in said upper portion and said lower portion, whereby said upper portion can be assembled to said lower portion in a number of different configurations each having different heights.

9. The adapter of claim 7 in which said means for connecting and selectively spacing comprises a middle insert, said middle insert being configured to fit between said upper portion and said lower portion and to attach at a proximal end to said upper portion and at a distal end to said lower portion, whereby the overall height of said adapter is determined by the combined heights of said upper portion, said lower portion, and said middle insert.

* * * * *